(12) United States Patent
Kung et al.

(10) Patent No.: US 6,696,305 B2
(45) Date of Patent: Feb. 24, 2004

(54) METAL POST MANUFACTURING METHOD

(75) Inventors: Moriss Kung, Hsin-Tien (TW); Kwun-Yao Ho, Hsin-Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 163 days.

(21) Appl. No.: 10/124,068

(22) Filed: Apr. 15, 2002

(65) Prior Publication Data

US 2003/0139032 A1 Jul. 24, 2003

(30) Foreign Application Priority Data

Jan. 23, 2002 (TW) ........................................ 91101024 A

(51) Int. Cl.$^7$ ........................... H01L 21/00; H01L 21/44
(52) U.S. Cl. ........................ 438/6; 438/106; 438/121; 438/126; 438/614
(58) Field of Search ......................... 438/6, 123, 599, 438/626, 614, 106, 121, 125, 126; 257/703, 675, 700, 678, 734, 723

(56) References Cited

U.S. PATENT DOCUMENTS

| | | | | |
|---|---|---|---|---|
| 4,685,210 A | * | 8/1987 | King et al. ................... 29/830 |
| 4,711,026 A | * | 12/1987 | Swiggett et al. ............... 29/850 |
| 4,859,807 A | * | 8/1989 | Swiggett et al. ............. 174/259 |
| 5,129,830 A | * | 7/1992 | Krajewski et al. ............. 439/75 |
| 5,154,621 A | * | 10/1992 | Legrady ....................... 439/82 |
| 5,195,350 A | * | 3/1993 | Aikens et al. ................. 72/402 |
| 5,304,512 A | * | 4/1994 | Arai et al. .................... 29/827 |
| 5,529,524 A | * | 6/1996 | Jones .......................... 445/24 |
| 5,565,385 A | * | 10/1996 | Rostoker et al. ............. 438/614 |
| 5,578,796 A | * | 11/1996 | Bhatt et al. .................. 174/260 |
| 6,124,152 A | * | 9/2000 | Yim .......................... 438/126 |
| 6,323,549 B1 | * | 11/2001 | deRochemont et al. ...... 257/703 |
| 6,336,815 B1 | * | 1/2002 | Bestul et al. .................. 439/66 |
| 6,388,208 B1 | * | 5/2002 | Kiani et al. .................. 174/266 |
| 6,596,549 B2 | * | 7/2003 | Kitamura et al. ............... 438/6 |

* cited by examiner

Primary Examiner—Michael S. Lebentritt
(74) Attorney, Agent, or Firm—J. C. Patents

(57) ABSTRACT

A method of forming metal posts. A fixture having an array of wire guide heads is provided. A conductive wire is threaded through a hole in each wire guide heads. The wire guide heads have a transient electric arcing mechanism for heating the conductive wire so that a teardrop shaped blob of material is formed at the tip of the conductive wire. The wire guide heads on the fixture are pulled towards a substrate, thereby forming a plurality of metal posts over the substrate. The technique of forming metal posts finds applications in the manufacturing of printed circuit board, package substrate (carrier) and silicon wafer.

27 Claims, 14 Drawing Sheets

METAL POST MANUFACTURING METHOD

CROSS-REFERENCE TO RELATED APPLICATION

This application claims the priority benefit of Taiwan application Ser. no. 91101024, filed Jan. 23, 2002.

BACKGROUND OF THE INVENTION

1. Field of Invention

The present invention relates to a metal post manufacturing method. More particularly, the present invention relates to a metal post manufacturing method that involves the conduction of a transient electric arc welding using a conductive electrode. The metal posts serve as via plugs on a ceramic circuit board, a soft or hard plastic circuit board, a glass substrate or a silicon wafer.

2. Description of Related Art

Due to rapid progress in the electronic industry, electronic products continue to shrink in size and increase is functional capacity. In chip packaging area, ball grid array (BGA) and chip scale (CS) packages are developed through market's demand for miniaturization and highly integrated packages. In the manufacturing of printed circuit boards, a multi-layered structure is introduced to reduce area occupation of electronic circuits. To connect various circuit layers within the substrate of a ball grid array package or a chip scale package, a multi-layered printed circuit board or a wafer, conductive via plugs are often formed. Hence, dimensions of minor circuits and plugs within the substrate layer will largely affect the packing density of a package and the level of integration of a printed circuit board and a wafer.

FIGS. 1 through 9 are schematic cross-sectional views showing the progression of steps for forming a conventional build-up substrate board. As shown in FIG. 1, an insulating core layer 100 having a conductive layer 102 on each side of the core layer 100 is provided. In general, the conductive layers 102 are copper layers.

As shown in FIG. 2, a plurality of through holes 104 are formed in the insulating core layer 100 by laser drilling or mechanical drilling. A conductive layer 106 is formed on the sidewalls of the through holes 104 as well as the two surfaces of the insulating core layer 102. The conductive layer 106 is also a copper layer. The conductive layer 106 is formed, for example, by forming a seeding layer before conducting an electroplating operation.

As shown in FIGS. 3 and 4, a hole-filling operation is carried out. An insulating material 108 is deposited into the through holes 104. The purpose of filling the through hole 104 is to prevent the intrusion of any moisture. Any moisture that gets into the through hole 104 may expand in the presence of heat to form popcorn-like bubbles. Thereafter, any insulating material 108 above the insulating core layer 100 is ground down to a suitable roughness level.

As show in FIG. 5, a conductive layer 110 is formed over the second surface of the insulating core layer 100 globally. The conductive layer 110 covers the exposed insulating material 108 above the insulating core layer 100. The conductive layer 110 is formed, for example, by forming a seeding layer before conducting an electroplating operation.

As shown in FIG. 6, the conductive layer 110 on each side of the core layer 100 is patterned by coating a photoresist layer, conducting photo-exposure, developing the photoresist, etching the conductive layer 110 and removing the photoresist layer.

As shown in FIG. 7, a dielectric layer 112 is formed over each side of the insulating core layer 100. The dielectric layer 112 has a plurality of openings 114. Each opening 114 exposes a portion of the conductive layer 110.

As shown in FIG. 8, a conductive layer 116 is formed over the dielectric layers 112, the sidewalls of the openings 114, and the exposed conductive layer 110. The conductive layer 116 is formed, for example, by forming a seeding layer before conducting an electroplating operation.

As shown in FIG. 9, conductive material is deposited into the openings 114 to form a plurality of via plugs 118. The conductive layer 116 is patterned by coating a photoresist layer, conducting photo-exposure, developing the photoresist, etching the conductive layer 116 and removing the photoresist layer.

In the conventional build-up substrate manufacturing method, the conductive layers 110 are electrically connected through a plug formed by a plating through-hole (PTH) process. The conductive layer 110 and the conductive layer 116 are electrically connected through a via plug 118. In other words, to produce the build-up substrate, holes must be drilled to form the through holes 104, electroplating must be conducted to form the conductive layers (106, 110 and 116) and insulating material 108 must be deposited to fill the through holes. Hence, the conventional fabrication method is both time consuming and complicated.

Moreover, as the level of integration increases and the size of through holes 104 reduces to a diameter of 100 μm or less, the conventional method no longer can provide a suitable means of fabrication.

SUMMARY OF THE INVENTION

Accordingly, one object of the present invention is to provide a metal post manufacturing method capable of producing via plugs having a dimension ranging from 1 to 200 μm. The metal post manufacturing method according to this invention is able to replace the conventional plating through-hole (PTH) process.

To achieve these and other advantages and in accordance with the purpose of the invention, as embodied and broadly described herein, the invention provides a metal post manufacturing method. A fixture having an array of wire guide heads thereon is provided. Each wire guide head contains a conductive wire. A substrate receiving the metal posts is put under the wire guide heads of the fixture. The wire guide heads utilize the production of a transient electric arc to generate the energy necessary for transforming one end of the conductive wire into a dangling block of material having a teardrop shape underneath the guide head. Simultaneously, the entire fixture moves and pulls the array of wire guide heads down to form a plurality of metal posts over the substrate.

In this invention, the conductive wire is made from a material such as aluminum, gold, silver, copper, platinum, zinc or lead-tin alloy. Alternatively, the conductive wire may contain a core material enclosed by one or more conductive material layers such as a copper layer enclosing a lead-tin core, a lead-tin layer enclosing a copper core or a tin or a silver layer enclosing an alloy steel core. In addition, the conductive wire may have a diameter ranging between 1 to 200 μm.

In this invention, the wire guide heads move towards the substrate so that the teardrop shaped block of conductive material may attach to the substrate. Thereafter, the wire guide heads are pulled in the opposite direction away from the substrate so that height level of the metal post can be properly set. Height level of the metal posts may be modified according to the specification. To form a metal post having a height over the dielectric layer about 1 to 10 μm, a teardrop shaped block of conductive material is repeatedly formed over the one already attached. In addition, dimension of the metal posts can be controlled by choosing conductive wires with the optimum diameter, from smaller than 50 μm, between 50 to 100 μm, between 100 to 200 μm to 200 μm and beyond.

The metal post manufacturing method according to this invention may also be applied to the fabrication of a printed circuit board, the substrate (carrier) of a package or a wafer.

This invention also provides a method of forming a build-up substrate board. A carrier having a first conductive layer thereon is provided. The aforementioned metal post manufacturing method is applied to form a plurality of first metal posts over the first conductive layer. A first dielectric layer is formed over the first conductive layer. The first dielectric layer encloses the first metal posts but the upper ends of the first metal posts are exposed. A second conductive layer is formed over the first dielectric layer. Removing the carrier, the first conductive layer and the second conductive layer are concurrently patterned. Finally, a build-up process is carried out to form material layers over the first and the second conductive layer.

In this invention, the first dielectric layer is formed, for example, by placing a sheet-shaped dielectric layer over the carrier. The first metal posts pierce through the sheet-shaped dielectric layer. The first dielectric layer may also be formed by spin coating operation or curtain coating, especially for a very fine metal post processing.

After forming the first dielectric layer, a curing operation of the first dielectric layer may be carried out. Thereafter, the upper ends of the metal posts are pressed in a coining operation or laminated with the copper foil.

In the build-up process, second metal posts may form over the substrate by conducting the same metal post manufacturing method. A dielectric layer and a conductive layer are sequentially formed. The conductive layer is patterned. The number of layers formed by the build-up process depends on actual requirements.

To pattern the conductive layer, a seed layer is formed over the dielectric layer before forming the conductive layer. Thereafter, a patterned photoresist layer is formed over the conductive layer. The conductive layer and the seed layer outside the photoresist layer are removed together. Finally, the photoresist layer is also removed.

In an alternative method of patterning the conductive layer, a seed layer is formed over the dielectric layer before forming a patterned photoresist layer over the seed layer so that a portion of the seed layer is exposed. Thereafter, a conductive layer is formed over the exposed seed layer. The photoresist layer is removed. Finally, the seed layer and a fraction of the thickness of the conductive layer are removed through a flash etching operation. In a flash etching operation, fine circuit lines are produced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 10 through 17 and FIGS. 20 through 23 are schematic cross-sectional views showing the progression of steps for forming a build-up substrate board according to a second preferred embodiment of this invention;

DESCRIPTION OF THE PREFERRED EMBODIMENTS

Figure 1:
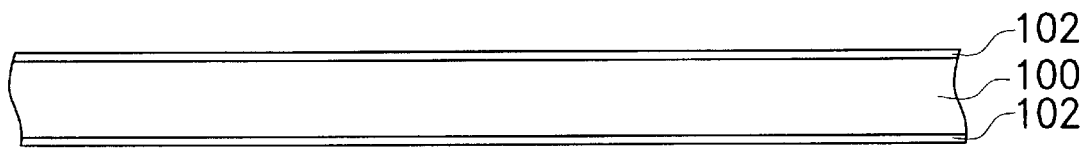
FIGS. 1 through 9 are schematic cross-sectional views showing the progression of steps for forming a conventional build-up substrate board.
Figure 2:
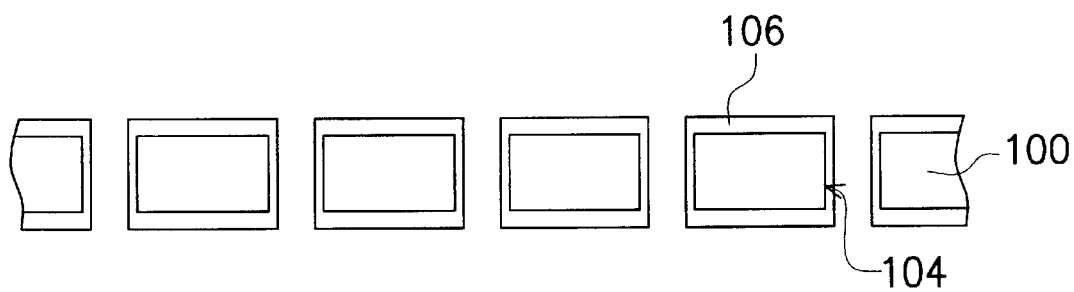
Figure 3:
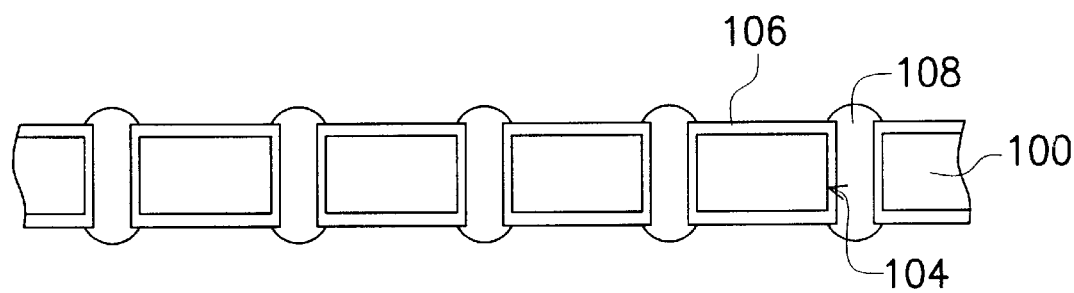
Figure 4:
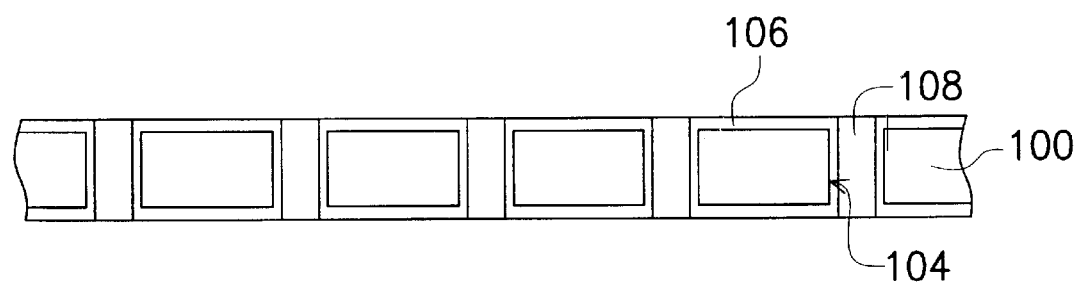
Figure 5:
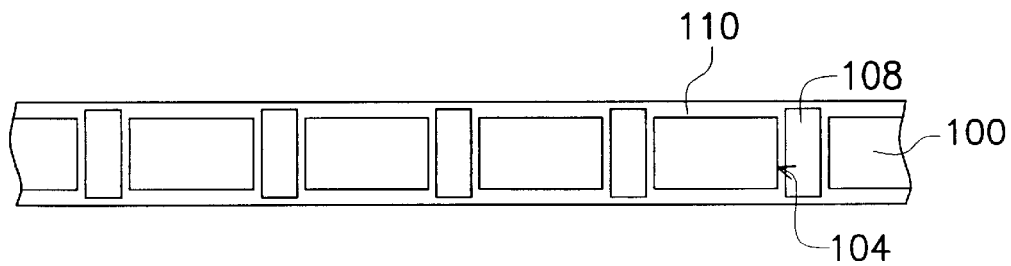
Figure 6:
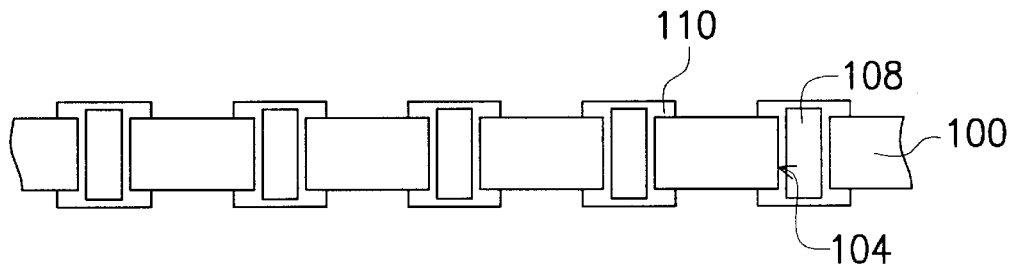
Figure 7:
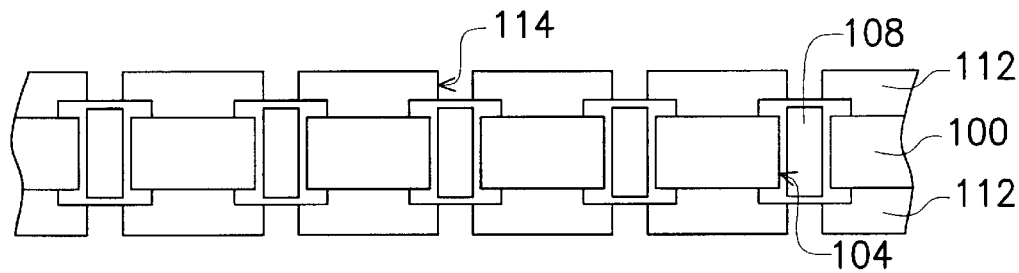
Figure 8:
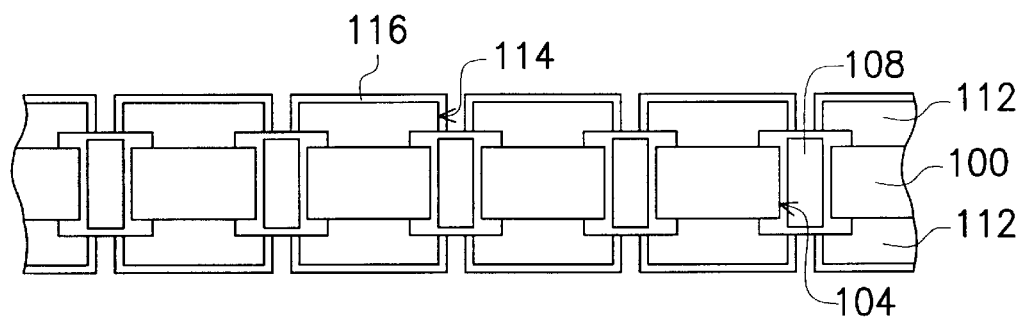
Figure 9:
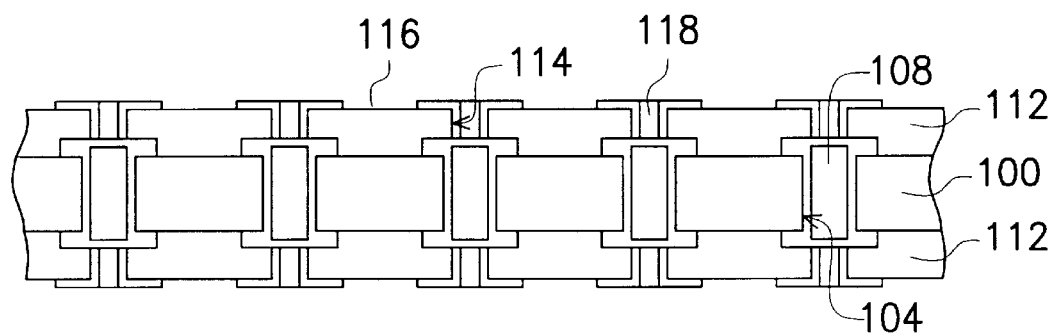

Reference will now be made in detail to the present preferred embodiments of the invention, examples of which are illustrated in the accompanying drawings. Wherever possible, the same reference numbers are used in the drawings and the description to refer to the same or like parts.

Figure 10:
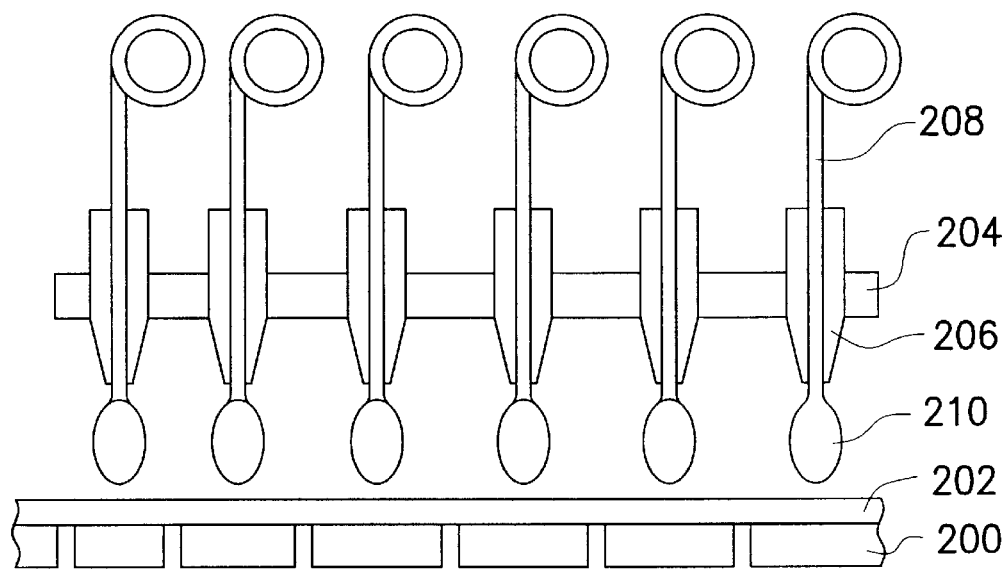
FIGS. 10 through 19 are schematic cross-sectional views showing the progression of steps for forming a build-up substrate board according to a first preferred embodiment of this invention.

FIGS. 10 through 19 are schematic cross-sectional views showing the progression of steps for forming a build-up substrate board according to a first preferred embodiment of this invention. As shown in FIG. 10, a carrier 200 having a conductive layer 202 thereon is provided. The conductive layer 202, for example, can be a copper layer. A fixture 204 having a plurality of wire guide heads 206 therein is provided. The wire guide heads 206 have heat production capability. Each wire guide head 206 holds a conductive wire 208. The conductive wire 208 is made from a material including, for example, aluminum, gold, silver, copper, platinum, zinc and lead-tin alloy. Alternatively, the conductive wire 208 may have a composite structure consisting of a first conductive layer enclosing a second conductive core layer such as a copper (Cu), gold (Au) or silver (Ag) material enclosing a lead-tin, tin or lead core; a lead-tin, tin or lead material enclosing a copper (Cu), gold (Au) or silver (Ag) core; and a tin, silver (Ag), copper (Cu), or gold (Au) material enclosing an alloy steel core. The conductive wire 208 has an outer diameter ranging between 1 to 200 μm or greater than 200 μm. In general, the conductive wire 208 has a diameter between 1 to 100 μm.

As shown in FIG. 10, the fixture 204 is placed over the carrier 200. The conductive wires 208 thread through the holes inside the wire guide heads 206. By forming a transient electric arc through the conductive wire 208, the conductive wire 208 is heated to a high temperature to form a teardrop shaped conductive blob 210 at the end of the conductive wire 208.

Figure 11:
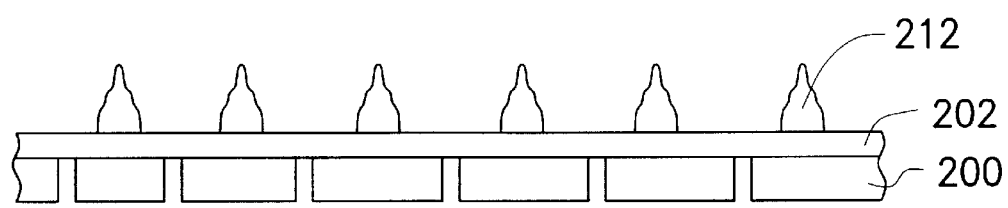

As shown in FIG. 11, the fixture 204 is driven to move towards the carrier 200 so that the teardrop shape blob 210 attaches to the conductive layer 202. Thereafter, the fixture 204 is pulled away from the carrier 200 so that metal posts 212 are formed on the conductive layer 202. The profile and height level of the metal posts 212 depend on the rapidity of movement of the fixture 204 and a proper control of the moving direction. Moreover, height of the metal posts 212 may be adjusted by repeating the aforementioned attachment operation. In this embodiment, the metal post 212 may have a height ranging from 1 to 10 µm above a subsequently formed dielectric layer 214. Furthermore, dimension of the metal posts 212 is largely controlled by the diameter of the conductive wire deployed.

Figure 12:
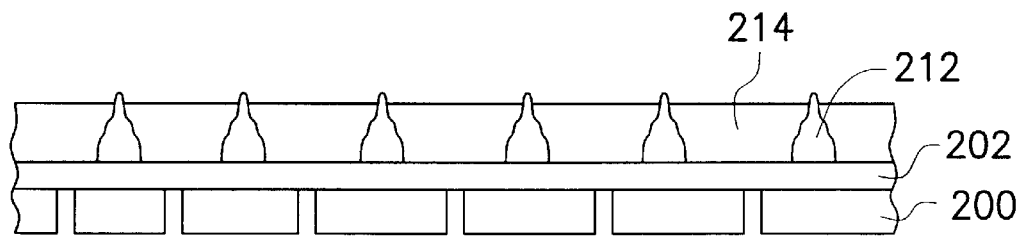

As shown in FIG. 12, a dielectric layer 214 is formed over the conductive layer 202. The dielectric layer 214 encloses the metal posts 212 but exposes the upper ends of the metal posts 212. The dielectric layer 214 is formed, for example, by placing a dielectric sheet over the conductive layer 202 and permitting the metal posts 212 to pierce through the dielectric sheet. Alternatively, the dielectric layer 214 is formed over the conductive layer 202 by conducting a spin coating or a curtain coating operation.

Figure 13:
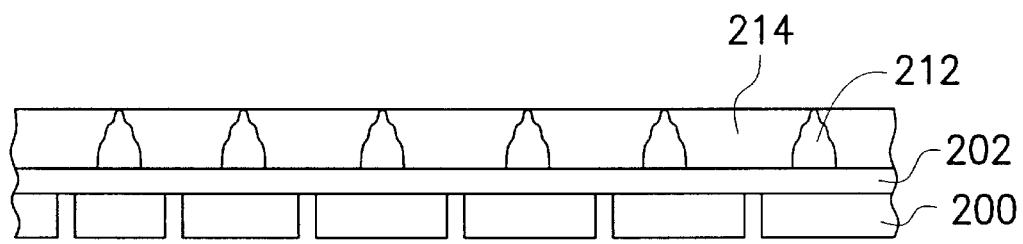

As shown in FIG. 13, the dielectric layer 214 is cured. A coining operation is carried out so that the upper ends of the metal posts 212 are flattened.

Figure 14:
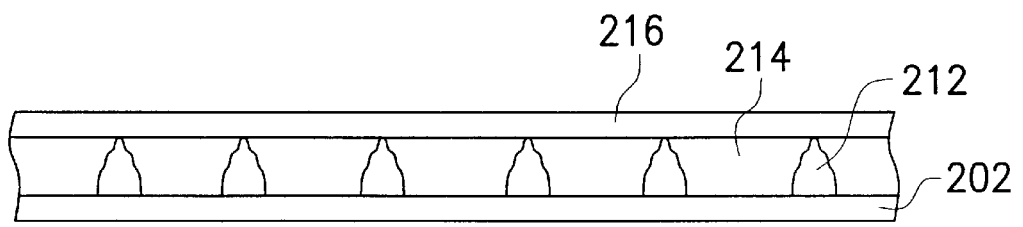

As shown in FIG. 14, the carrier 200 is removed after the coining and curing operating. A conductive layer 216 is formed over the dielectric layer 214. To ensure good electrical connection with the conductive layer 216, the upper ends of the metal posts 212 are surface-treated by conducting a plasma etching operation or a plastic residue decontamination operation. The conductive layer 216 can be a copper layer formed, for example, by growing a seed layer over the dielectric layer 214 before conducting an electroplating operation.

The coining and the curing of the dielectric layer 214 and the fabrication of the conductive layer 216 as shown in FIGS. 13 and 14 can be conducted concurrently. For example, the conductive layer 216 is formed over the dielectric layer 214 by conducting a vacuum high pressure stamping process so that the dielectric layer 214 is coined and cured at the same time.

Figure 15:
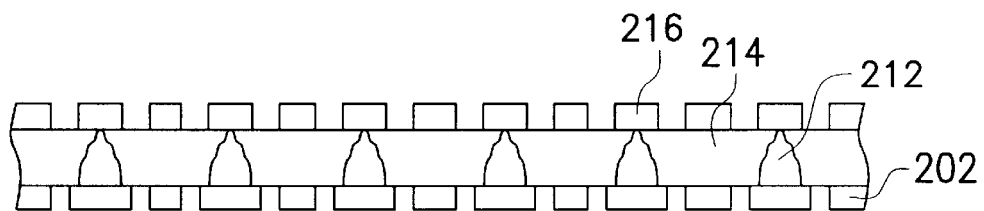

As shown in FIG. 15, the conductive layers 202 and 216 are patterned by forming a photoresist layer, conducting a photo-exposure of the photoresist layer, developing the photoresist layer chemically, etching the conductive layers 202 and 216 and finally removing the photoresist layer. The conductive layer 202 and the conductive layer 216 are connected through the metal posts 212 after the patterning operation.

Figure 16:
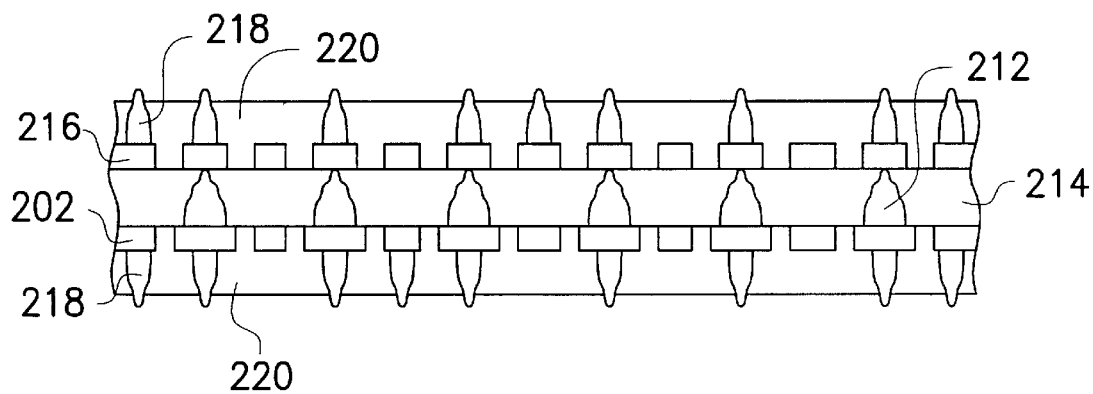

As shown in FIG. 16, metal posts 218 are formed on the patterned conductive layers 202 and 216. A dielectric layer 220 is formed over the respective surfaces of the dielectric layer 214. The dielectric layers 220 enclose the metal posts 218 but expose the upper ends of the metal posts 218. The dielectric layers 220 are formed, for example, by placing a dielectric sheet over the dielectric layer 214 and permitting the metal posts 218 to pierce through the dielectric sheet. Alternatively, the dielectric layers 220 are formed over the dielectric layer 214 by conducting a spin coating or a curtain coating operation.

Figure 17:
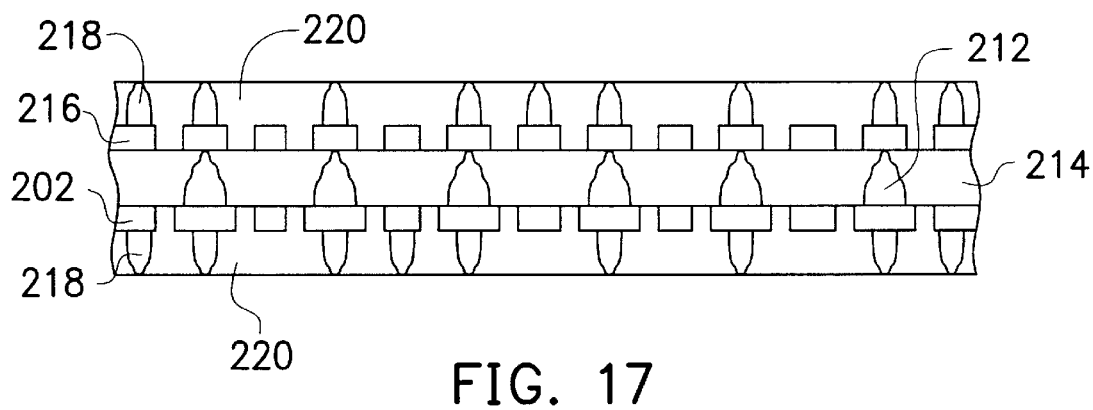

As shown in FIG. 17, the dielectric layers 220 are cured. A coining operation is carried out so that the upper ends of the metal posts 218 are flattened to the same level as the dielectric layer 220.

Figure 18:
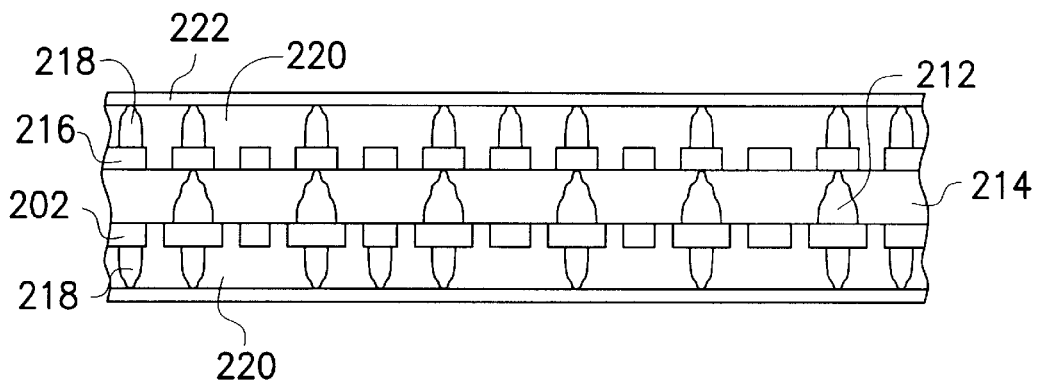

As shown in FIG. 18, conductive layers 222 are formed over the dielectric layers 220. To ensure good electrical connection with the conductive layers 222, the upper ends of the metal posts 218 are surface-treated by conducting a plasma etching operation or a plastic residue decontamination operation. The conductive layers 222 can be a copper layer formed, for example, by growing a seed layer over the dielectric layers 220 before conducting an electroplating operation, or laminating with the copper foil directly.

The coining and the curing of the dielectric layer 220 and the fabrication of the conductive layers 222 as shown in FIGS. 17 and 18 can be conducted concurrently. For example, the conductive layers 222 are formed over the dielectric layer 220 by conducting a vacuum high pressure stamping process so that the dielectric layers 220 are coined and cured at the same time.

Figure 19:
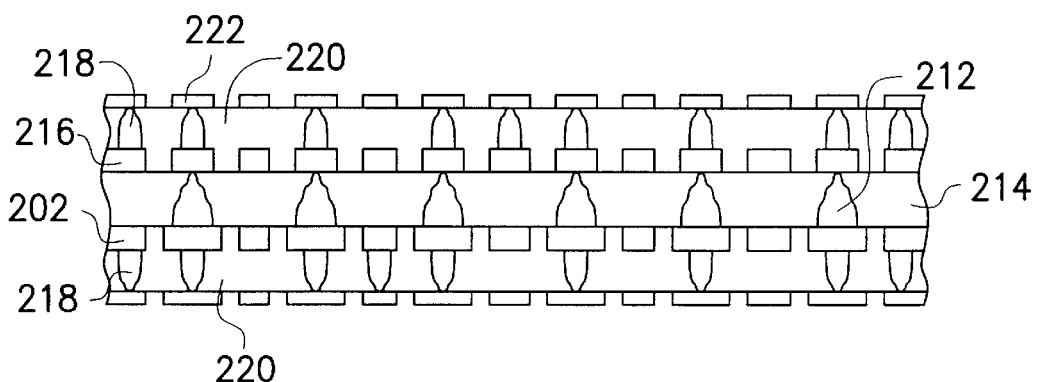

As shown in FIG. 19, the conductive layers 222 are patterned by forming a photoresist layer, conducting a photo-exposure of the photoresist layer, developing the photoresist layer chemically, etching the conductive layers 222 and finally removing the photoresist layer. The conductive layers 222 are electrically connected to the conductive layers 202 and 216 through the metal posts 218 after the patterning operation.

FIGS. 10 through 17 and FIGS. 20 through 23 are schematic cross-sectional views showing the progression of steps for forming a build-up substrate board according to a second preferred embodiment of this invention. Since the initial steps from FIGS. 10 to 17 in the first embodiment are again used in the second embodiment, detailed description is omitted.

Figure 20:
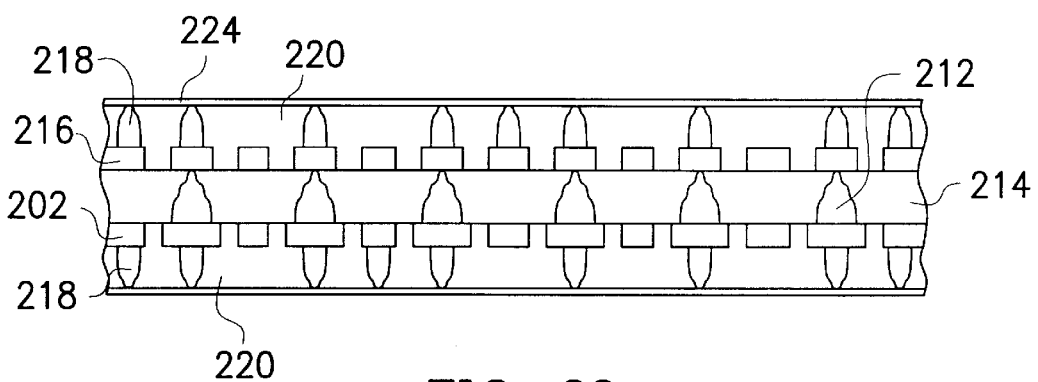

As shown in FIG. 20, conductive layers 224 are formed over the respective dielectric layers 220 after the coining and the curing operation. To ensure good electrical connection with the conductive layers 224, the upper ends of the metal posts 218 are surface-treated by conducting a plasma etching operation or a plastic residue decontamination operation. The conductive layer 224 can be a copper layer, for example. The conductive layers 224 later serves as a seed layer.

Figure 21:
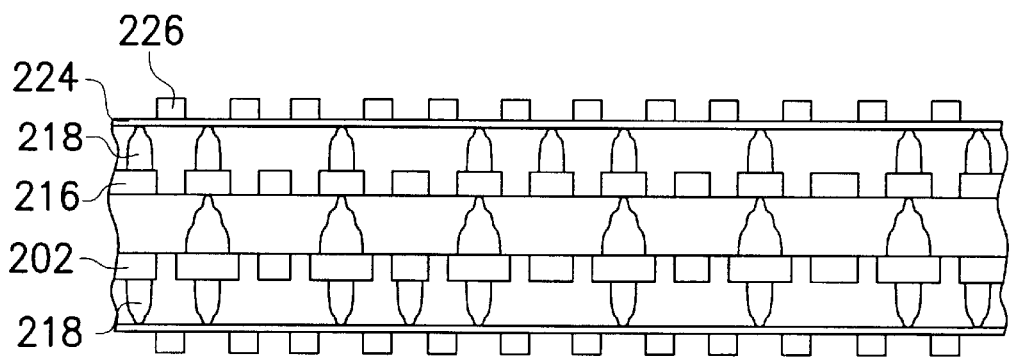
Figure 22:
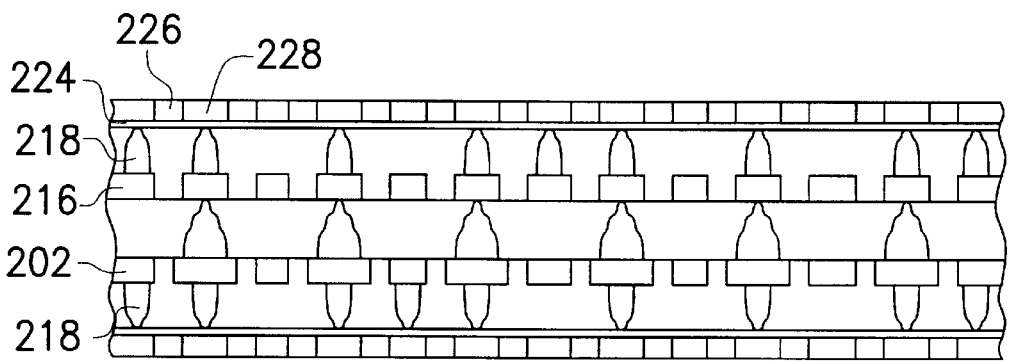

As shown in FIGS. 21 and 22, photoresist layers 226 are formed over the respective conductive layers 224 by forming a photoresist layer over the conductive layers 224, photo-exposing the photoresist layer and developing the exposed photoresist layer. Thereafter, conductive layers 228 are formed over the exposed conductive layers 224. The conductive layer 228 can be a copper layer, for example.

Figure 23:
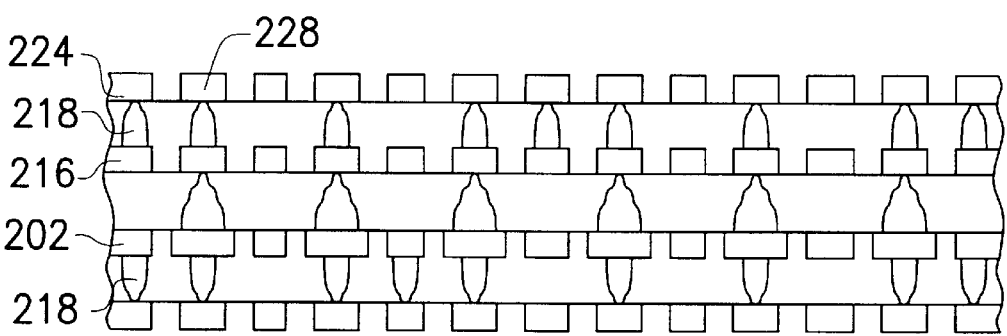

As shown in FIG. 23, the photoresist layer 226 is removed and the conductive layers 224 and 228 are concurrently etched. Since the conductive layer 224 has a thickness smaller than the conductive layer 228, the etching operation is stopped as soon as the conductive layer 224 is completely removed and the dielectric layer 220 is exposed. The patterned conductive layers 228 are electrically connected to the conductive layer 202 and the conductive layer 216 respectively through the metal posts 218.

In the second embodiment, a flash etching technique is used to remove conductive layer 224 so that finer circuit lines are formed on the substrate board.

Figure 24:
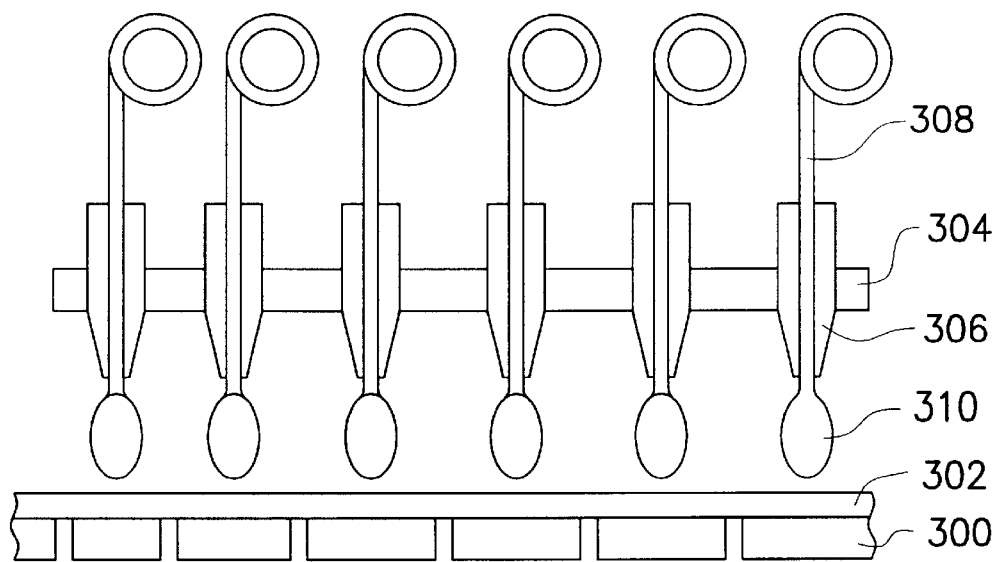
FIGS. 24 through 36 are schematic cross-sectional views showing the progression of steps for forming a build-up substrate board according to a third preferred embodiment of this invention.

FIGS. 24 through 36 are schematic cross-sectional views showing the progression of steps for forming a build-up substrate board according to a third preferred embodiment of this invention. As shown in FIG. 24, a carrier 300 having a conductive layer 302 thereon is provided. The conductive layer 302, for example, can be a copper layer. A fixture 304 having a plurality of wire guide heads 306 therein is provided. The wire guide heads 306 have heat production capability. Each wire guide head 306 holds a conductive wire 308. The conductive wire 308 is made from a material including, for example, aluminum, gold, silver, copper, platinum, zinc and lead-tin alloy. Alternatively, the conductive wire 308 may have a composite structure consisting of a first conductive layer enclosing a second conductive core layer such as a copper (Cu), gold (Au) or silver (Ag) material enclosing a lead-tin, tin or lead core; a lead-tin, tin or lead material enclosing a copper (Cu), gold (Au) or silver (Ag) core; and a tin, silver (Ag), copper (Cu), or gold (Au) material enclosing an alloy steel core. The conductive wire 308 has an outer diameter ranging between 1 to 200 μm or greater than 200 μm. In general, the conductive wire 308 has a diameter between 1 to 50 μm.

As shown in FIG. 24, the fixture 304 is placed over the carrier 300. The conductive wires 308 thread through the holes inside the wire guide heads 306. By forming a transient electric arc through the conductive wire 308, the conductive wire 308 is heated to a high temperature to form a teardrop shaped conductive blob 310 at the end of the conductive wire 308.

Figure 25:
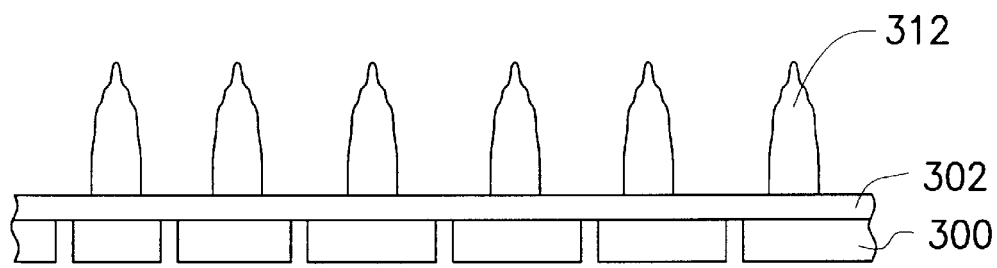

As shown in FIG. 25, the fixture 304 is driven to move towards the carrier 300 so that the teardrop shape blob 310 attaches to the conductive layer 302. Thereafter, the fixture 304 is pulled away from the carrier 300 so that metal posts 312 are formed on the conductive layer 302. The profile and height level of the metal posts 312 depend on the rapidity of movement of the fixture 304 and a proper control of the moving direction. Moreover, height of the metal posts 312 may be adjusted by repeating the aforementioned attachment operation. In this embodiment, the metal post 312 may have a height ranging from 1 to 10 μm above a subsequently formed dielectric layer 314. Furthermore, dimension of the metal posts 312 is largely controlled by the diameter of the conductive wire deployed. In general, diameter of the metal posts 312 is under 50 μm, between 50 to 100 μm, between 100 to 200 μm or above 200 μm.

Figure 26:
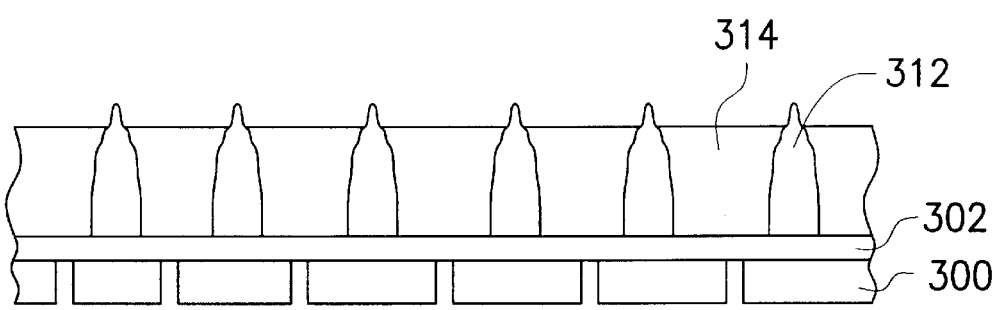

As shown in FIG. 26, a dielectric layer 314 is formed over the conductive layer 302. The dielectric layer 314 encloses the metal posts 312 but exposes the upper ends of the metal posts 312. The dielectric layer 314 is formed, for example, by placing a single or multiple layered dielectric sheet over the conductive layer 302 and permitting the metal posts 312 to pierce through the dielectric sheet. Alternatively, the dielectric layer 314 is formed over the conductive layer 302 by conducting a spin coating or a curtain coating operation.

Figure 27:
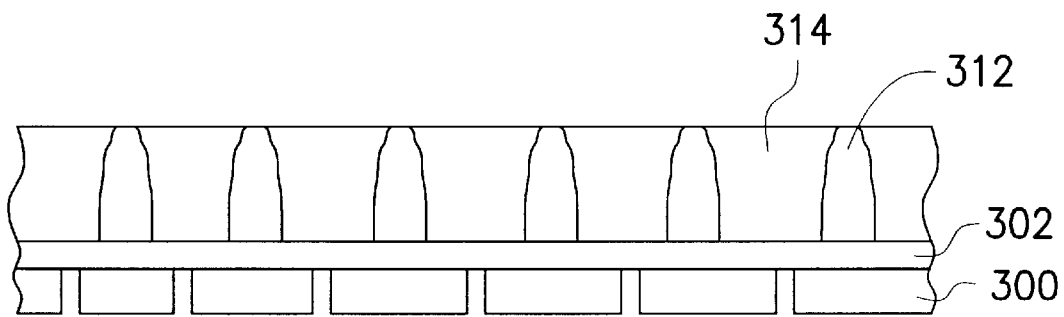

As shown in FIG. 27, the dielectric layer 314 is cured. A coining operation is carried out so that the upper ends of the metal posts 312 are flattened.

Figure 28:
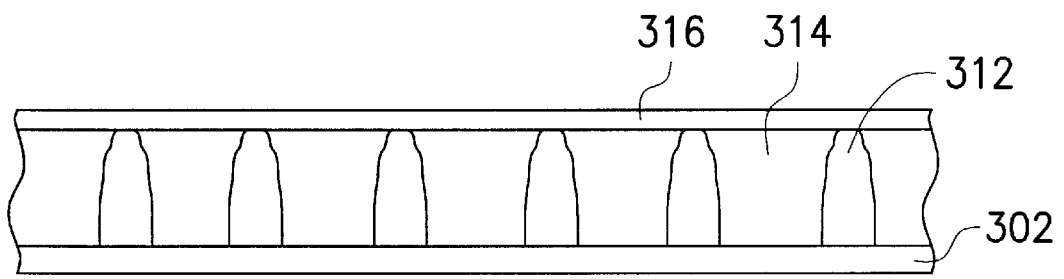

As shown in FIG. 28, the carrier 300 is removed after the coining and curing operating. A conductive layer 316 is formed over the dielectric layer 314. To ensure good electrical connection with the conductive layer 316, the upper ends of the metal posts 312 are surface-treated by conducting a plasma etching operation or a plastic residue decontamination operation. The conductive layer 316 can be a copper layer formed, for example, by growing a seed layer over the dielectric layer 314 before conducting an electroplating operation.

The coining and the curing of the dielectric layer 314 and the fabrication of the conductive layer 316 as shown in FIGS. 27 and 28 can be conducted concurrently. For example, the conductive layer 316 is formed over the dielectric layer 314 by conducting a vacuum high pressure stamping process so that the dielectric layer 314 is coined and cured at the same time.

Figure 29:
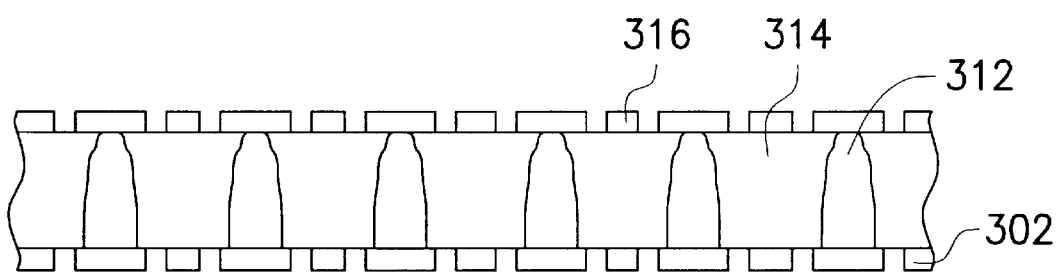

As shown in FIG. 29, the conductive layers 302 and 316 are patterned by forming a photoresist layer, conducting a photo-exposure of the photoresist layer, developing the photoresist layer chemically, etching the conductive layers 302 and 316 and finally removing the photoresist layer. The conductive layer 302 and the conductive layer 316 are electrically connected through the metal posts 312 after the patterning operation.

Figure 30:
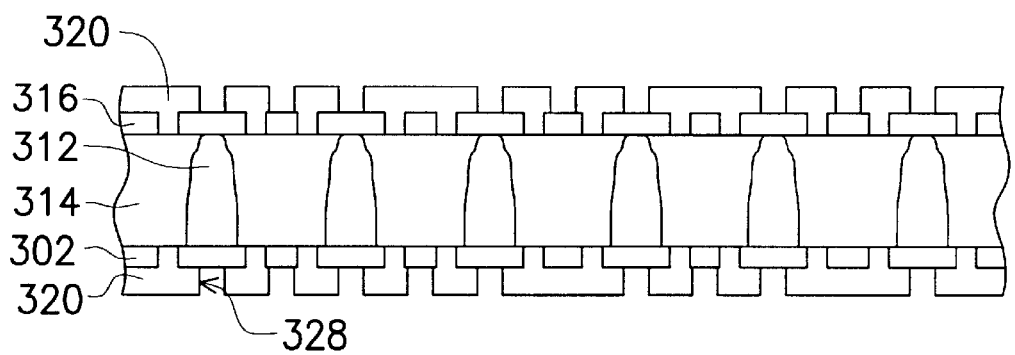

As shown in FIG. 30, dielectric layers 320 are formed over the conductive layers 302 and 316 respectively. The dielectric layer 320 has a plurality of openings 328 that expose the conductive layers 302 and 316. The dielectric layers 320 are formed over the conductive layer 302 and the conductive layer 316, for example, by spin coating or curtain coating.

Figure 31:
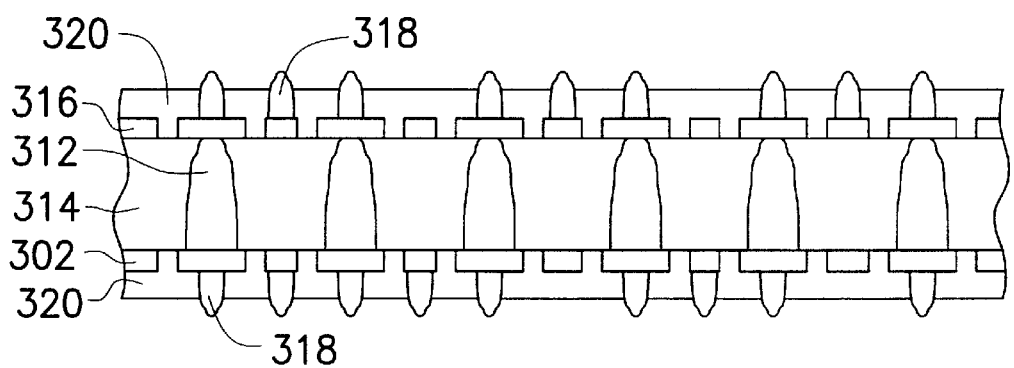

As shown in FIG. 31, metallic material is deposited into the openings 328 to form metal posts 318. The dielectric layer 320 encloses the conductive posts 318 and exposes only the top ends of the conductive posts 318.

Figure 32:
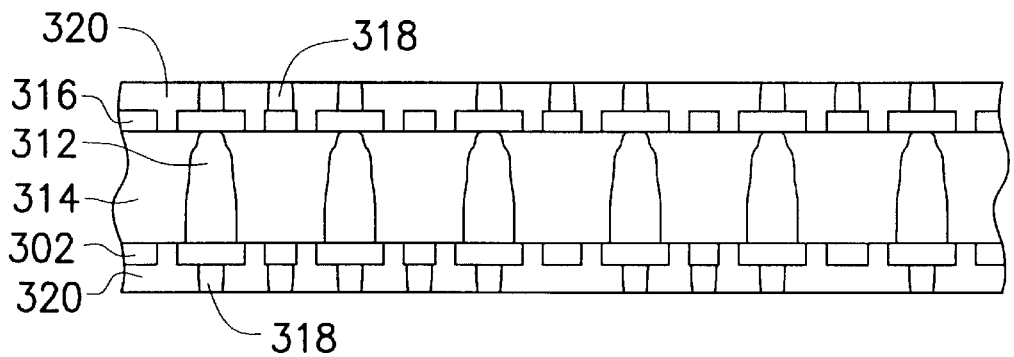

As shown in FIG. 32, a coining operation is carried out so that the upper ends of the metal posts 318 are flattened to the same level as the dielectric layer 320.

Figure 33:
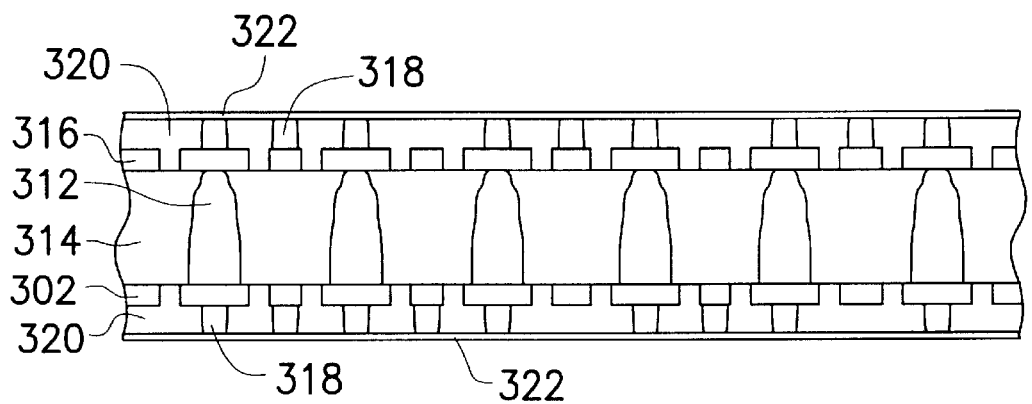

As shown in FIG. 33, conductive layers 322 are formed over the dielectric layers 320. The conductive layers 322 are copper layers, for example. The conductive layers 322 serve as a seed layer for subsequent use.

Figure 34:
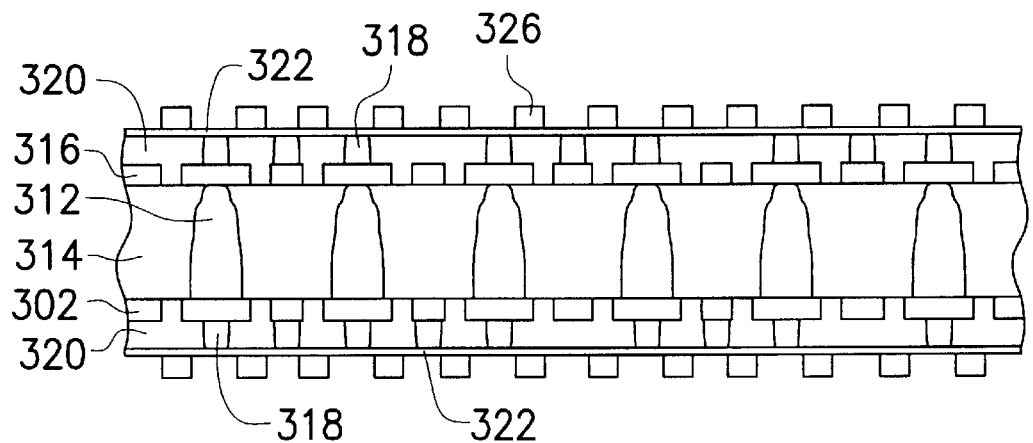
Figure 35:
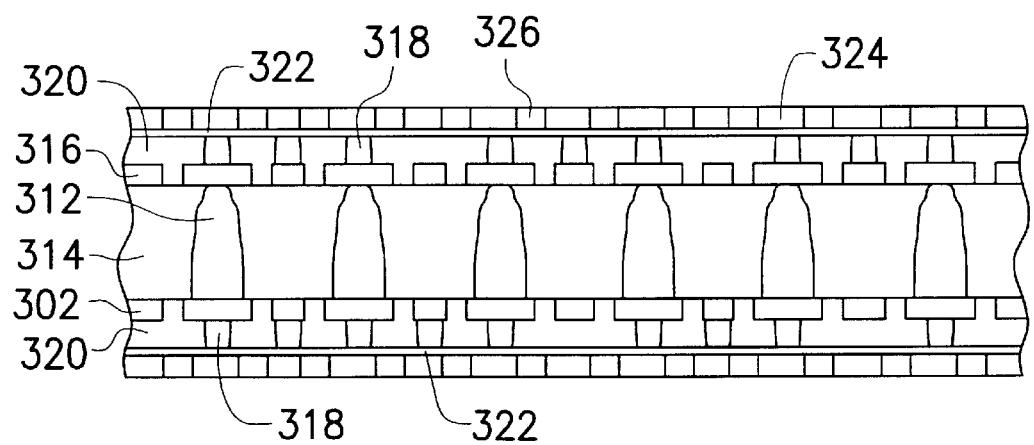

As shown in FIGS. 34 and 35, a photoresist layer 326 is formed over the respective conductive layers 322 by forming a photoresist layer, exposing the photoresist layer to light and developing the exposed photoresist layer chemically. Conductive layers 324 are formed over the exposed conductive layers 322. In fact, the photoresist layer 326 determines the locations for forming the conductive layers 324. The conductive layers 324 are, for example, copper layers. In this embodiment, a flash etching technique is used to remove the conductive layer 322 so that finer circuit lines are formed on the substrate board.

Figure 36:
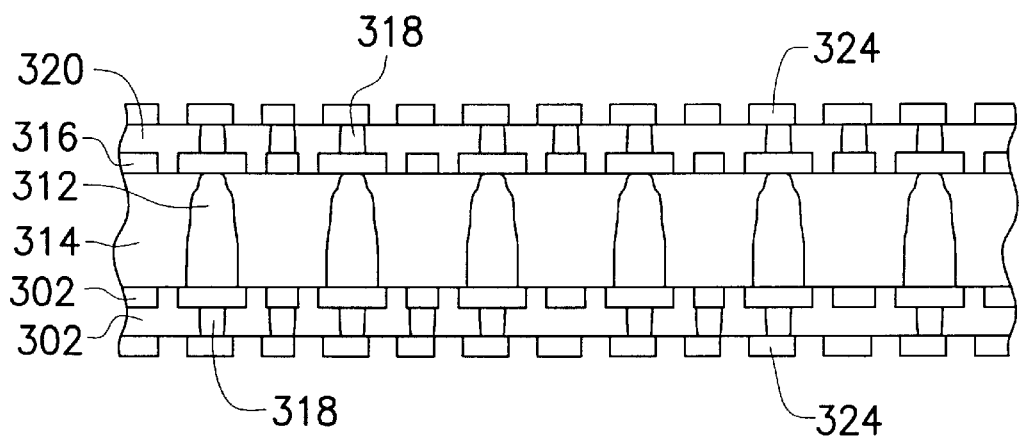

As shown in FIG. 36, the photoresist layer 326 is removed and the conductive layers 322 and 324 are concurrently etched. Since the conductive layer 322 has a thickness smaller than the conductive layer 324, the etching operation is stopped as soon as the conductive layer 322 is completely removed and the dielectric layer 320 is exposed. The patterned conductive layers 324 are electrically connected to the conductive layer 302 and the conductive layer 316 respectively through the metal posts 318.

Figure 37:
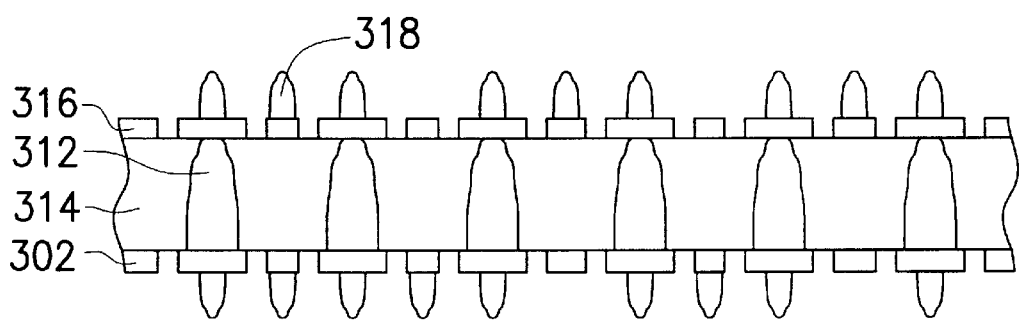
FIGS. 37 and 38 are schematic cross-sectional views showing alternative steps that can substitute for the steps shown in FIGS. 30 and 31.
Figure 38:
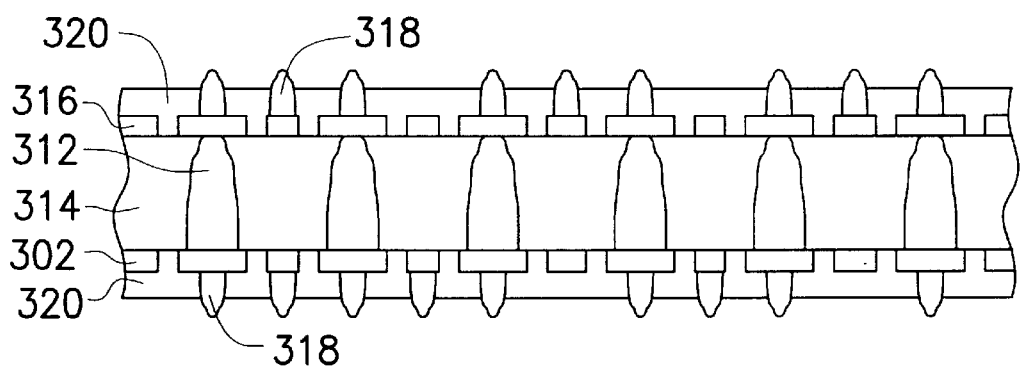

FIGS. 37 and 38 are schematic cross-sectional views showing alternative steps that can substitute for the steps shown in FIGS. 30 and 31. As shown in FIGS. 37 and 38, metal posts 318 are formed over the conductive layers 302 and 316 before forming the dielectric layer 320. The sequence is exactly the opposite of the one shown in FIGS. 30 and 31, where the dielectric layer 320 is formed before the metal posts 318.

Figure 39:
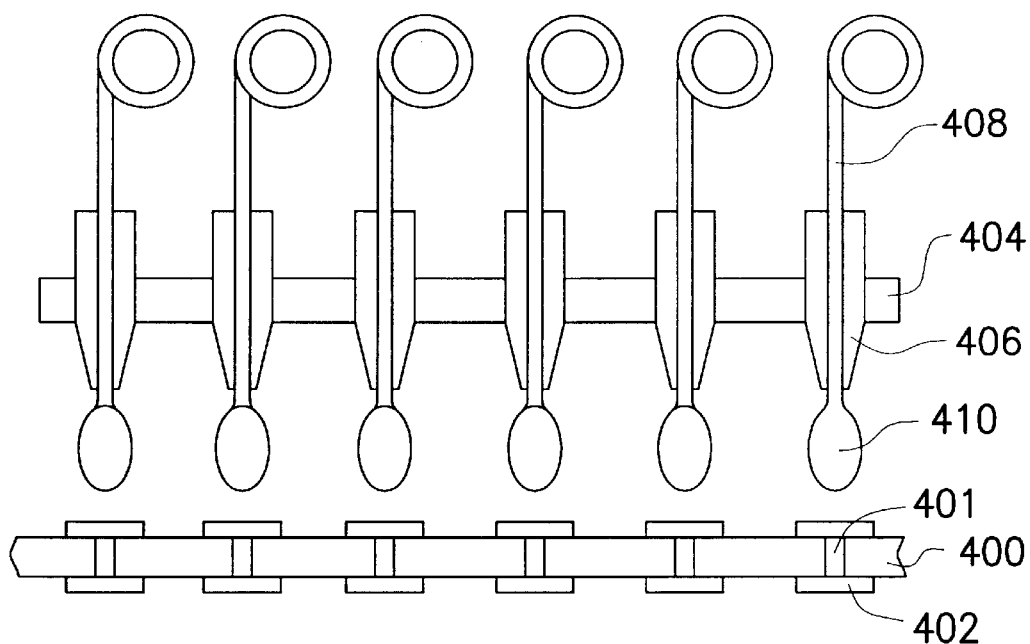
FIGS. 39 through 44 are schematic cross-sectional views showing the progression of steps for forming a build-up substrate board according to a fourth preferred embodiment of this invention.

FIGS. 39 through 44 are schematic cross-sectional views showing the progression of steps for forming a build-up substrate board according to a fourth preferred embodiment of this invention. As shown in FIG. 39, a substrate board with plugged holes is provided. The substrate board can be a single or a multiple-layered board, a multiple-layered soft circuit board, a multiple-layered hard circuit board or a wafer. The substrate board comprises an insulating core layer 400 having a plurality of plated through holes (PTH) 401 and a conductive layer 402 on each side of the insulating core layer 400. The conductive layer 402, for example, can be a copper layer. A fixture 404 having a plurality of wire guide heads 406 therein is provided. The wire guide heads 406 have heat production capability. Each wire guide head 406 holds a conductive wire 408. The conductive wires 408 are made from a material including, for example, aluminum, gold, silver, copper, platinum, zinc and lead-tin alloy. Alternatively, the conductive wires 408 may have a composite structure consisting of a first conductive layer enclosing a second conductive core layer such as a copper (Cu), gold (Au) or silver (Ag) material enclosing a lead-tin, tin or lead core; a lead-tin, tin or lead material enclosing a copper (Cu), gold (Au) or silver (Ag) core; and a tin, silver (Ag), copper (Cu), or gold (Au) material enclosing an alloy steel core. The conductive wires 408 have an outer diameter ranging between 1 to 200 µm or greater than 200 µm. In general, the conductive wires 208 have a diameter between 1 to 50 µm.

As shown in FIG. 39, the fixture 404 is placed over the insulation core layer 400 having plugged holes therein. The conductive wires 408 thread through the holes inside the wire guide heads 406. By forming a transient electric arc through the conductive wire 408, the conductive wire 408 is heated to a high temperature to form a teardrop shaped conductive blob 410 at the end of the conductive wire 408.

Figure 40:
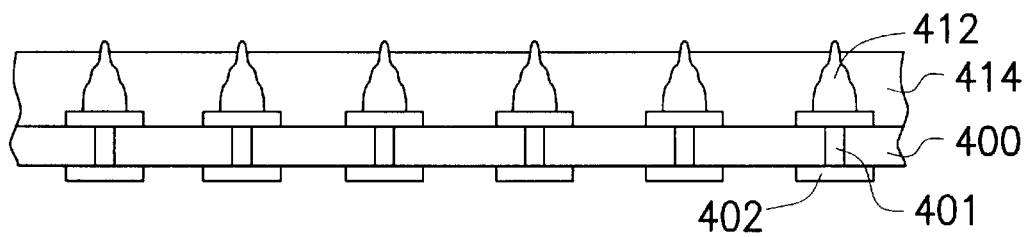

As shown in FIG. 40, the fixture 404 is driven to move towards the insulation core layer 400 so that the teardrop shape blob 410 is attached to the conductive layer 402. Thereafter, the fixture 404 is pulled away from the insulating core layer 400 so that metal posts 412 are formed on the conductive layer 402. The profile and height level of the metal posts 412 depend on the rapidity of movement of the fixture 404 and a proper control of the moving direction. Moreover, height of the metal posts 412 may be adjusted by repeating the aforementioned attachment operation. In this embodiment, the metal post 412 may have a height ranging from 1 to 10 µm above a subsequently formed dielectric layer 414. Furthermore, dimension of the metal posts 412 is largely controlled by the diameter of the conductive wire deployed. In general, diameter of the metal posts 412 is under 50 µm, between 50 to 100 µm, between 100 to 200 µm or above 200 µm.

A dielectric layer 414 is formed over the conductive layer 402. The dielectric layer 414 encloses the metal posts 412 but exposes the upper ends of the metal posts 412. The dielectric layer 414 is formed, for example, by placing a dielectric sheet over the conductive layer 402 and permitting the metal posts 412 to pierce through the dielectric sheet. Alternatively, the dielectric layer 414 is formed over the conductive layer 402 by conducting a spin coating or a curtain coating operation.

Figure 41:
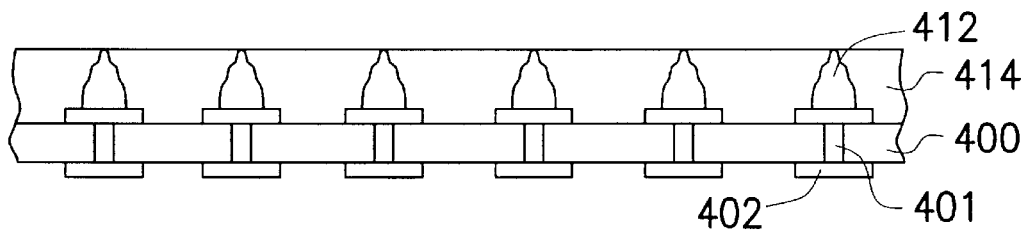

As shown in FIG. 41, the dielectric layer 414 is cured. A coining operation is carried out so that the upper ends of the metal posts 412 are flattened.

Figure 42:
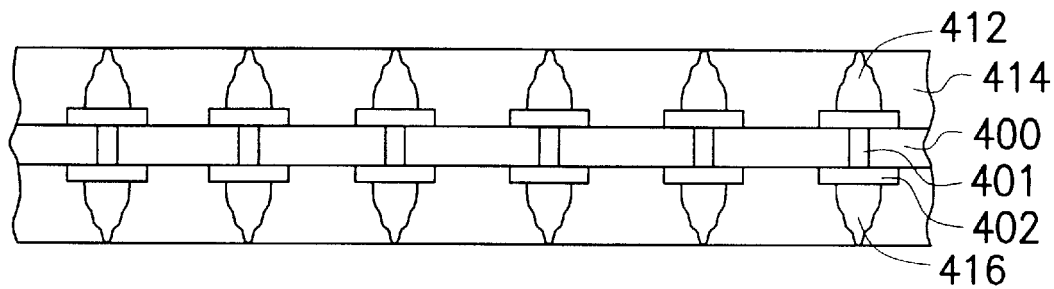

As shown in FIG. 42, the processes described in FIGS. 40 and 41 are repeated to form metal posts 412 and an enclosing dielectric layer 414 over the other side of the insulating core layer 400. Similarly, coining operation is carried out to flatten the upper ends of the metal posts 412.

Figure 43:
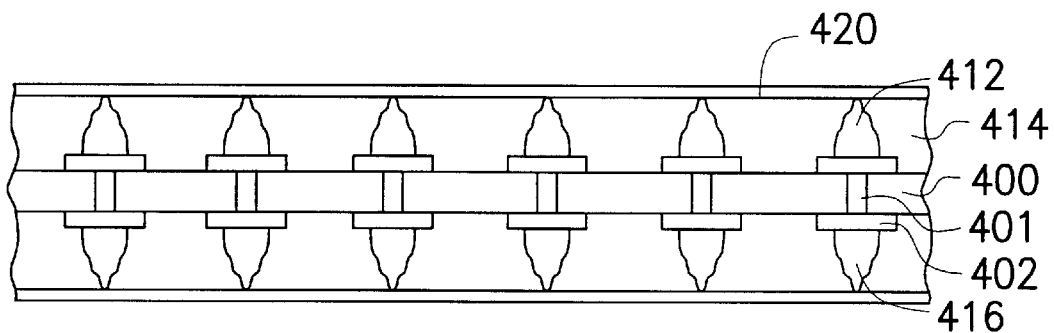

As shown in FIG. 43, a conductive layer 420 is formed over the dielectric layer 414. To ensure good electrical connection with the conductive layer 420, the upper ends of the metal posts 412 are surface-treated by conducting a plasma etching operation or a plastic residue decontamination operation. The conductive layer 420 can be a copper layer formed, for example, by growing a seed layer over the dielectric layer 414 before conducting an electroplating operation.

The coining and the curing of the dielectric layer 414 and the fabrication of the conductive layer 402 as shown in FIG. 42 and the formation of the conductive layer 420 as shown in FIG. 43 can be conducted concurrently. For example, the conductive layer 420 is formed over the dielectric layer 414 by conducting a vacuum high pressure stamping process so that the dielectric layer 414 is coined and cured at the same time.

Figure 44:
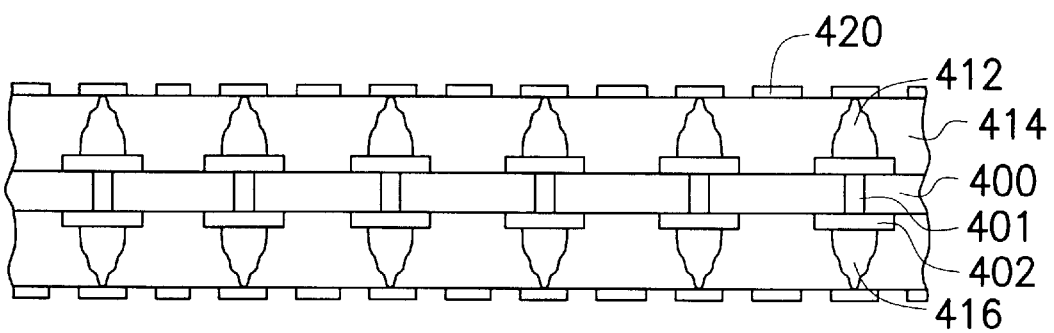

As shown in FIG. 44, the conductive layers 402 and 420 are patterned by forming a photoresist layer, conducting a photo-exposure of the photoresist layer, developing the photoresist layer chemically, etching the conductive layers 402 and 420 and finally removing the photoresist layer. The conductive layer 402 and the conductive layer 420 are connected through the metal posts 412 after the patterning operation.

The method of forming a build-up substrate according to this invention can be applied to the fabrication of a printed circuit board or a package substrate (carrier). Furthermore, the technique for forming metal posts can be applied to produce the via plugs in a printed circuit board, a packaging substrate (carrier) or a silicon wafer.

In conclusion, major advantages of this invention includes:

1. Metal posts are formed quickly.
2. Height level of metal posts can be adjusted by repeating the teardrop attachment operation.
3. The metal post fabrication process permits the production of metal posts with very small diameters through the use of very fine metallic wires.
4. The way metal posts are produced eliminates the need for complicated processing steps including drilling, electroplating and hole plugging.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming metal posts over a substrate, comprising the steps of:

providing a conductive wire;

providing a fixture having a plurality of wire guide heads thereon, wherein each wire guide head has an electric arcing mechanism for heating up a conductive wire;

threading the conductive wire through a hole in each wire guide head and forming a teardrop shaped blob at the tip of the conductive wire by producing a transient arc current through the conductive wire; and moving the wire guide heads to form metal posts on the substrate.

2. The method of claim 1, wherein the conductive wire may have a composite structure having:

a first conductive material core; and at least one second conductive material layer surrounding the first conductive material core.

3. The method of claim 1, wherein the conductive wire has an outer diameter between about 1 to 200 µm.

4. The method of claim 1, wherein the step of moving the wire guide heads includes the sub-steps:

moving the wire guide heads towards the substrate such that the teardrop shaped blob is attached to the substrate; and retracting the wire guide heads away from the substrate for controlling height level and dimension of the metal posts.

5. The method of claim 1, wherein step of moving the wire guide heads includes the sub-steps:
   moving the wire guide heads towards the substrate such that the teardrop shaped blob is attached to the substrate;
   retracting the wire guide heads away from the substrate for controlling height level and dimension of the metal posts; and
   repeating the aforementioned steps at least once.

6. The method of claim 1, wherein the substrate includes a printed circuit board.

7. The method of claim 1, wherein the substrate includes a chip packaging carrier.

8. The method of claim 1, wherein the substrate includes a silicon wafer.

9. A build-up substrate process, comprising the steps of:
   providing a carrier having a first conductive layer thereon;
   forming a plurality of metal posts on the first conductive layer, and the method of forming the metal posts includes:
      providing a conductive wire;
      providing a fixture having a plurality of wire guide heads therein, wherein the wire guide heads uses a transient electric arc for heating up a conductive wire;
      threading a conductive wire into the hole of each wire guide head and forming a teardrop shaped blob at the end of a conductive wire through the application of a transient electric arc; and
      moving the wire guide heads to form the metal posts on the first conductive layer;
   forming a first dielectric layer over the first conductive layer, wherein the first dielectric layer encloses the metal posts but exposes the top ends of the metal posts;
   forming a second conductive layer over the first dielectric layer;
   removing the carrier;
   patterning the first conductive layer and the second conductive layer; and
   conducting at least one layer-building process over the first conductive layer and the second conductive layer.

10. The process of claim 9, wherein the conductive wire may have a composite structure having:
    a first conductive material core; and
    at least one second conductive material layer surrounding the first conductive material core.

11. The process of claim 10, wherein the conductive wire has an outer diameter between about 1 to 200 $\mu$m.

12. The process of claim 9, wherein the step of moving the wire guide heads includes the sub-steps:
    moving the wire guide heads towards the substrate such that the teardrop shaped blob is attached to the substrate; and
    retracting the wire guide heads away from the substrate for controlling height level and dimension of the metal posts.

13. The method of claim 9, wherein the step of moving the wire guide heads includes the sub-steps:
    moving the wire guide heads towards the substrate such that the teardrop shaped blob is attached to the substrate;
    retracting the wire guide heads away from the substrate for controlling height level and dimension of the metal posts; and
    repeating the aforementioned steps at least once.

14. The process of claim 9, wherein the metal post reaches a height level between 1 to 10 $\mu$m above the first dielectric layer.

15. The process of claim 9, wherein the first dielectric layer includes a sheet-shaped dielectric layer that can be pierced by the first metal posts.

16. The process of claim 9, wherein the step of forming the first dielectric layer includes spin coating.

17. The process of claim 9, wherein the step of forming the first dielectric layer includes curtain coating.

18. The process of claim 9, wherein after forming the first dielectric layer, further includes:
    curing the first dielectric layer; and
    pressing the upper end of the metal posts in a coining operation.

19. The method of claim 9, wherein after forming the first dielectric layer, further includes:
    curing the first dielectric layer; and
    pressing the upper end of the metal posts by laminating with a copper oil.

20. The process of claim 9, wherein the layer-building step further includes:
    forming a plurality of second metal posts over the first conductive layer and the second conductive layer;
    forming a second dielectric layer over the first conductive layer;
    forming a third conductive layer over the second dielectric layer and patterning the third conductive layer;
    forming a third dielectric layer over the second conductive layer; and
    forming a fourth conductive layer over the third dielectric layer and patterning the fourth conductive layer.

21. The process of claim 9, wherein the layer-building step further includes:
    forming a plurality of second metal posts over the first conductive layer and the second conductive layer;
    forming a second dielectric layer over the first conductive layer;
    forming a third conductive layer over the second dielectric layer and patterning the third conductive layer; and
    repeating the aforementioned steps at least once.

22. The process of claim 21, wherein the second dielectric layer is a sheet-shaped dielectric layer that can be pierced by the second metal posts.

23. The process of claim 21, wherein the step of forming the second dielectric layer includes spin coating.

24. The process of claim 21, wherein the step of forming the second dielectric layer includes curtain coating.

25. The process of claim 21, wherein the third dielectric layer is a sheet-shaped dielectric layer that can be pierced by the second metal posts.

26. The process of claim 21, wherein the step of forming the third dielectric layer includes spin coating.

27. The process of claim 21, wherein the step of forming the third dielectric layer includes curtain coating.

* * * * *